United States Patent
Frampton et al.

(10) Patent No.: US 8,883,320 B2
(45) Date of Patent: Nov. 11, 2014

(54) LIGHT-EMITTING DEVICE

(75) Inventors: Michael Frampton, Oxfordshire (GB);
Sophie Heidenhain, Cambourne (GB);
Annette Steudel, Cambridge (GB);
Jonthan N. G. Pillow, Cambridge (GB);
Scott Watkins, Williamstown (AU);
Nigel Male, Cambridge (GB)

(73) Assignee: CDT Oxford Ltd., Cambridgeshire (GB)

( * ) Notice: Subject to any disclaimer, the term of this patent is extended or adjusted under 35 U.S.C. 154(b) by 804 days.

(21) Appl. No.: 11/597,386

(22) PCT Filed: May 16, 2005

(86) PCT No.: PCT/GB2005/001871
§ 371 (c)(1),
(2), (4) Date: Jul. 19, 2007

(87) PCT Pub. No.: WO2005/117160
PCT Pub. Date: Dec. 8, 2005

(65) Prior Publication Data
US 2008/0036368 A1    Feb. 14, 2008

(30) Foreign Application Priority Data
May 24, 2004    (GB) .................................. 0411572.1

(51) Int. Cl.
| | |
|---|---|
| *H01L 51/54* | (2006.01) |
| *C09K 11/06* | (2006.01) |
| *H01L 51/00* | (2006.01) |
| *H05B 33/14* | (2006.01) |
| *H01L 51/50* | (2006.01) |

(52) U.S. Cl.
CPC .......... *H01L 51/008* (2013.01); *H01L 51/0084* (2013.01); *C09K 2211/185* (2013.01); *H01L 51/0059* (2013.01); *C09K 11/06* (2013.01); *H01L 51/0085* (2013.01); *H01L 51/0062* (2013.01); *H01L 51/5016* (2013.01); *H05B 33/14* (2013.01); *C09K 2211/1044* (2013.01); *Y10S 428/917* (2013.01)
USPC .............. 428/690; 428/917; 313/504; 257/40

(58) Field of Classification Search
None
See application file for complete search history.

(56) References Cited

U.S. PATENT DOCUMENTS

| | | | |
|---|---|---|---|
| 5,061,569 A | 10/1991 | VanSlyke et al. |
| 5,554,450 A | 9/1996 | Shi et al. |

(Continued)

FOREIGN PATENT DOCUMENTS

| | | | |
|---|---|---|---|
| EP | 0 901 176 A2 | 3/1999 |
| EP | 0 949 850 A1 | 10/1999 |

(Continued)

OTHER PUBLICATIONS

Machine translation of JP2000-103975. Date of publication: Apr. 11, 2000.*

(Continued)

*Primary Examiner* — Andrew K Bohaty
(74) *Attorney, Agent, or Firm* — Marshall, Gerstein & Borun LLP

(57) ABSTRACT

A light emitting device comprising: an anode; a cathode; a light emissive layer located between the anode and the cathode, said light emissive layer comprising a charged metal complex for emitting light and a counterion or counterions with sufficient charge to balance the change on the charged metal complex; characterized in that the counterion or counterions are substantially immobile so (that light output from the device is immediate, provided that the combined charged metal complex and counterion do not have General Formula: (I) or (II); where C—N is a cyclometallated liquid.

14 Claims, 1 Drawing Sheet

(56) References Cited

U.S. PATENT DOCUMENTS

| | | | |
|---|---|---|---|
| 5,723,873 | A | 3/1998 | Yang |
| 5,798,170 | A | 8/1998 | Zhang et al. |
| 5,853,905 | A | 12/1998 | So et al. |
| 5,853,906 | A * | 12/1998 | Hsieh .................... 428/690 |
| 6,268,695 | B1 | 7/2001 | Affinito |
| 2002/0041151 | A1 * | 4/2002 | Park et al. .................... 313/504 |
| 2002/0134984 | A1 | 9/2002 | Igarashi |
| 2003/0017361 | A1 | 1/2003 | Thompson et al. |
| 2003/0091862 | A1 * | 5/2003 | Tokito et al. .................... 428/690 |
| 2004/0018386 | A1 * | 1/2004 | Naito et al. .................... 428/690 |

FOREIGN PATENT DOCUMENTS

| | | |
|---|---|---|
| EP | 0 947 123 B1 | 2/2002 |
| GB | 2 348 316 A | 9/2000 |
| JP | 2000103975 A * | 4/2000 |
| JP | 2002/203678 | 7/2002 |
| WO | WO-98/10621 A1 | 3/1998 |
| WO | WO-00/48258 A1 | 8/2000 |
| WO | WO-00/55927 A1 | 9/2000 |
| WO | WO-01/19142 A1 | 3/2001 |
| WO | WO-01/81649 A1 | 11/2001 |
| WO | WO-2004/017043 A2 | 2/2004 |
| WO | WO-2004/020448 A1 | 3/2004 |

OTHER PUBLICATIONS

Slinker et al. J. Am. Chem. Soc. 2004, 126, 2763-2767. Date of online publication: Feb. 17, 2004.*

Bernhard et al., "Efficient Electroluminescent Devices Based on a Chelated Osmium(II) Complex," *Adv. Mater.*, 14(6):433-436 (2002).

Brunner et al., "Carbazole Compounds as Host Materials for Triplet Emitters in Organic Light-emitting Diodes: Tuning the HOMO Level Without Influencing the Triplet Energy in Small Molecules," *J. Am. Chem. Soc.*, 126(19):6035-6042 (2004).

Carlson et al., "Divalent Osmium Complexes: Synthesis, Characterization, Strong Red Phosphorescence, and Electrophosphorescence," *J. Am. Chem. Soc.*, 124(47):14162-14172 (2002).

Chen et al., "Triplet Exciton Confinement in Phosphorescent Polymer Light-emitting Diodes," *Appl. Phys. Lett.*, 82(7):1006-1008 (2003).

Cleave et al., "Harvesting Singlet and Triplet Energy in Polymer LEDs," *Adv. Mater.*, 11(4):285-288 (1999).

Ikai et al., "Highly Efficient Phosphorescence from Organic Light-emitting Devices with an Exciton-block Layer," *Appl. Phys. Lett.*, 79(2):156-158 (2001).

Lane et al., "Origin of Electrophosphorescence From a Doped Polymer Light Emitting Diode," *Phys. Rev. B.*, 63:235206-1-235206-8 (2001).

Lee et al., "Polymer Phosphorescent Light-emitting Devices Doped with Tris(2-phenylpyridine) Iridium as a Triplet Emitter," *Appl. Phys. Lett.*, 77(15):2280-2282 (2000).

Lees, "Luminescence Properties of Organometallic Complexes," *Chem. Rev.*, 87(4):711-743 (1987).

Maestri et al., "Photochemistry and Luminescence of Cyclometallated Complexes," *Advances in Photochemistry*, 17:1-68 (1992).

Noh et al., "Energy Transfer and Device Performance in Phosphorescent Dye Doped Polymer Light Emitting Diodes," *J. Chem. Phys.*, 118(6):2853-2864 (2003).

Noh et al., "Singlet and Triplet Energy Transfer in Phosphorescent Dye Doped Polymer Light Emitting Devices," *Mat. Res. Soc. Symp. Proc.*, 708:131-136 (2002).

O'Brien et al., "Electrophosphorescence From a Doped Polymer Light Emitting Diode," *Synthetic Metals*, 116:379-383 (2001).

Shirota, "Organic Materials for Electronic and Optoelectronic Devices," *J. Mater. Chem.*, 10:1-25 (2000).

Slinker et al., "Efficient Yellow Electroluminescence From a Single Layer of a Cyclometalated Iridium Complex," *J. Am. Chem. Soc.*, 126(9):2763-2767 (2004).

Zhu et al., "Synthesis of New Iridium Complexes and Their Electrophosphorescent Properties in Polymer Light-emitting Diodes," *J. Mater. Chem.*, 13:50-55 (2003).

Search Report for Application No. GB0411572.1, dated Nov. 25, 2004.

International Search Report for International Application No. PCT/GB2005/001871, dated Sep. 7, 2005.

Written Opinion for International Application No. PCT/GB2005/001871, dated Sep. 7, 2005.

* cited by examiner

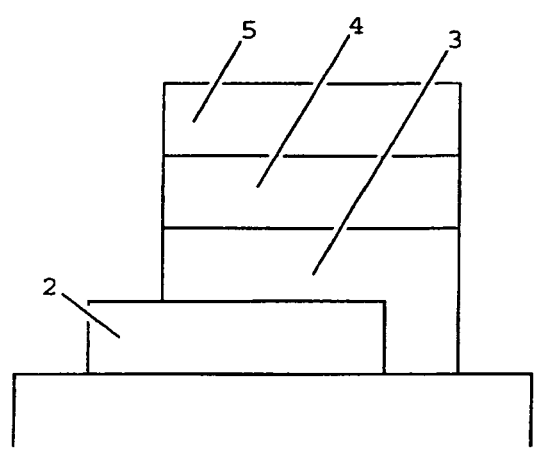

LIGHT-EMITTING DEVICE

BACKGROUND OF THE INVENTION

1. Field of the Invention

The present invention relates to a light-emitting device and to a method of making the same.

2. Related Technology

In the last decade, much effort has been devoted to the improvement of the emission efficiency of light-emitting devices (LEDs) either by developing highly efficient materials or efficient device structures.

FIG. 1 shows cross-section of a typical LED. The device has an anode 2, a cathode 5 and a light emissive layer 4 located between the anode and the cathode. The anode may be, for example, a layer of transparent indium tin oxide. The cathode may be, for example, LiAl. Holes and electrons that are injected into the device recombine radiatively in the light emissive layer. A further feature of the device is the optional hole transport layer 3. The hole transport layer may be a layer of polyethylene dioxythiophene (PEDOT) for example. This provides an energy level which helps the holes injected from the anode to reach the light emissive layer.

Known LED structures also may have an electron transport layer situated between the cathode 5 and a light emissive layer 4. This provides an energy level which helps the electrons ejected from the cathode to reach the light emissive layer.

In an LED, the electrons and holes that are injected from the opposite electrodes are combined to form two types of exitons; spin-symmetric triplets and spin-anti-symmetric singlets. Radiative decay from the singlet (fluorescence) is fast, but from the triplet (phosphorescence) is formally forbidden by the requirement of the spin conservation.

In the past few years, many have studied the incorporation of phosphorescent materials into the light emissive layer by blending. Often, the phosphorescent material is a metal complex, however it is not so limited. Further, metal complexes also sometimes are fluorescent.

A metal complex will comprise a metal ion surrounded by ligands. A ligand in a metal complex can have several roles. The ligand can be an "emissive" ligand which accepts electrons from the metal and then emits light. Alternatively, the ligand may be present simply in order to influence the energy levels of the metal. For example, where emission is from a ligand, it is advantageous to have strong field ligands coordinated to the metal to prevent energy loss via non-radiative decay pathways. Common strong field ligands are known to those skilled in this art and include CO, PPh3, and ligands where a negatively charged carbon atom bonds to the metal. N-donor ligands are also strong field ligands, although less so than those previously mentioned.

The effect of strong field ligands can be appreciated from an understanding of the mechanism by which light is emitted from a metal complex. Three reviews of luminescent metal complexes that provide an appreciation of this mechanism are referred to below.

Chem. Rev., 1987, 87,711-7434 is concerned with the luminescence properties of organometallic complexes. This review paper provides a brief summary of the excited states commonly found in organometallic complexes. The excited States that are discussed include metal-to-ligand charge-transfer (MLCT) states, which involve electronic transitions from a metal-centered orbital to a ligand-localized orbital. Thus, in a formal sense this excitation results in metal oxidation and ligand reduction. These transitions are commonly observed in organometallic complexes because of the low-valent nature of the metal center and the low-energy position of the acceptor orbitals in many ligands. Ligand to metal charge-transfer (LMCT) states also are mentioned which involve electronic transitions from a ligand-localized orbital to a metal-centered orbital.

In the section of the article that deals with photoluminescence, a sub-section is dedicated to metal carbonyl complexes, which are said to be recognized as being some of the most light-sensitive inorganic Materials. Examples include M(CO)-6 (M=V, Nb, Ta); and M(CO)6 (M=Cr, Mo, W).

Matrix isolation studies of M(CO)5L complexes, where M=Mo or W and L=pyridine, 3-bromopyridine, pyridazine, piperidine, trimethylphosphine, or trichlorophosphine, are reported also as they are said to have provided the first reports of fluorescence from substituted metal carbonyls.

Several Mo(CO)5L complexes, where L=a substituted pyridine ligand, are also mentioned and it is said that they are known to luminesce under fluid conditions. The emission has been assigned to a low-lying MLCT excited state Other sub-sections in this review article are dedicated to dinitrogen complexes; metallocenes; metal isocyanides; alkenes; and ortho-metalated complexes.

It is said that a number of examples of ortho-metalated complexes have been shown to luminesce in room temperature solutions. For example, the emission spectrum of [Ru(bpy)2(NPP)]+ is said to exhibit the structure associated with MLCT emission. Several ortho-metalated Pt(II) complexes also are mentioned where it is said that the emission may be assigned to a MLCT excited state.

The review article summarises that low-lying MLCT excited states are often observed, because of the low-valent metal centres and vacant low-energy ligand acceptor orbitals in organometallic complexes. Further, it is reported that relationships exist between the energy ordering of the excited-state levels and the observed photophysical and photochemical properties. Still further, it is said that the great majority of examples of room temperature emission have been attributed to MLCT excited states.

Analytical Chemistry, Vol. 63, NO, 17, Sep. 1, 1991, 829A to 837A is concerned with the design and applications of highly luminescent transition metal complexes especially those with platinum metals (Ru, Os, Re, Rh and Ir).

Table I in the Analytical Chemistry paper lists representative metal complexes categorized by luminescence efficiency. The systems are limited to those containing at least one $\alpha$-diimine ligand such as 2,2'-bipyridine (bpy) or 1,10-phenanthroline (phen), although many of the design rules and fundamental principles are said to apply to other classes of luminescent metal complexes.

In this paper it is explained that transition metal complexes are characterized by partially filled d orbitals and that to a considerable extent the ordering and occupancy of these orbitals determine emissive properties.

For a representative octahedral MX6 d6 metal complex, where M is the metal and X is a ligand that coordinates at one site, it is explained that the octahedral crystal field of the ligands splits the five degenerate d orbitals into a triply degenerate t level and a doubly degenerate e level. The magnitude of the splitting is given by the crystal field splitting, which is a particularly important parameter for determining the luminescence properties of the complex, whose size is determined by the crystal field strength of the ligands and the central metal ion. The luminescence properties of the complex thus can be controlled by altering the ligand, geometry, and metal ion.

There are three types of excited states mentioned in this paper: metal-centred d-d states, ligand-based $\pi$-$\pi$* states, and charge-transfer states.

Charge-transfer (CT) states involve both the organic ligand and the metal. As mentioned above, metal-to-ligand charge transfer (MLCT) involves promoting an electron from a metal orbital to a ligand orbital and ligand-to-metal charge transfer (LMCT) involves promoting an electron from a ligand to a metal orbital.

According to this paper, the most important design rule of luminescent transition metal complexes is that the emission always arises from the lowest excited state. Thus control of the luminescence properties of complexes hinges on control of the relative state energies and the nature and energy of the lowest excited state. In this regard, the paper states that any metal-centred d-d states must be well above the emitting level to prevent their thermal excitation, which would result in photochemical instability and rapid excited-state decay. Therefore, one of the more important criteria is to remove the lowest d-d state from competition with the emitting level. Thus a desirable design goal is to make the d-d state as thermally inaccessible as possible from the emitting MLCT or $\pi$-$\pi$* state. Controlling the energies of the d-d states is accomplished by varying either the ligands or the central metal ion to affect the crystal field splitting. Stronger crystal field strength ligands or metals raise d-d state energies, and crystal field strength increases in the series Cl<py<<bpy, phen<CN<CO where py represents pyridine.

For a metal, the crystal field splitting increases when descending a column in the periodic table. CT state energies are affected by the ease of oxidation/reduction of the ligands and metal ion. For MLCT transitions, more easily reduced ligands and more easily oxidized metals lower the MLCT states.

The $\pi$-$\pi$* state energies are largely dictated by the ligands themselves. However, the energies and intensities of the $\pi$-$\pi$* transitions can be altered by varying either the substituents, the heteroatoms in the aromatic ring, or the extent of $\pi$ conjugation.

Photochemistry And Luminescence Of Cyclometallated Complexes, Advances in Photochemistry, Volume 17, 1992, page 1 to 68 describes that most of the attention in this field has been focussed on complexes of the polypyridine-type family (prototype: Ru(bpy)2+3, where bpy=2,2' bipyridine).

The interest in the photochemical and photophysical properties of cyclometallated complexes is said to be an extension of this.

Table 2 in this publication shows absorption and emission properties of cyclometalated ruthenium, rhodium, iridium, palladium and platinum complexes and their ligands. Some of the complexes are charged and some are neutral.

Several examples exist where charged complexes have been used in LEDs or in photoluminescent studies. For example, JP 2002-203678 discloses some charged transition metal complexes. Further, in "Divalent Osmium Complexes: Synthesis, Characterisation, Strong Red Phosphorescence, and Electrophosphorescence" J. Am. Chem. Soc. 2002, 124, 14162-14172, divalent osmium complexes that feature strong red metal-to-ligand-charge-transfer phosphorescence and electrophosphorescence are disclosed. Red LEDs were fabricated by doping the Os (II) complexes into a blend of poly (N-vinylcarbazole) (PVK) and 2-tert-butylphenyl-5-biphenyl-1,3,4-oxadiazole (PBD).

Adv. Mater. 2002, 14, No. 6, March 18 "Efficient Electroluminescent Devices Based on a chelated Osmium (II) Complex" notes that among the many different classes of materials currently under investigation for the development of efficient solid state electroluminescent materials, transition metal complexes (and especially 1,2, diimine complexes of Ru) have emerged. This paper reports the fabrication and characterisation of the Os complex [Os(bpy)2L)]2+(PF6-)2, where L is cis-1,2,bis(diphenyl phosphino)ethylene. The structure for this complex is shown in the inset of FIG. 1 in this paper. This complex is reported as a luminescent material, which exhibited red-orange emission. In this paper, reference also is made to [Ru(bpy)3]2+(PF6-)2 devices.

J. Am. Chem. Soc. 2004, 126, 2763-2767 "Efficient Yellow Electroluminescence from a Single Layer of a Cyclometallated Iridium Complex" is concerned with the properties of [Ir(ppy)-2-(dtb-bpy)]+(PF6)-(ppy:2-phenylpyridine,dtp-bpy:4,4'-di-tert-butyl-2,2'-dipyridyl). According to the paper, single layer devices were fabricated and found to emit yellow light. The chemical structure of the iridium complex is shown inset in FIG. 2 in this paper.

SUMMARY OF THE INVENTION

In the above-mentioned prior art, the counterions used with charged metal complexes are small. These devices have a long turn on time and there is a considerable delay between the application of a potential and light emission. When these prior art devices are switched on, it is postulated that these counterions migrate. For example, small counter-anions migrate to the cathode. The device only becomes conducting once this migration is complete. This means that the prior art devices have a long device turn on time. Further, the accumulation of the small anions at the cathode leads to high electric fields at layer boundaries and variable light output for a constant voltage. As a consequence, to a large extent, research has been directed away from charged metal complexes. Where research has continued on charged metal complexes, this has focused on using small counterions because they can be run at a low voltage.

The present inventors have taken a different approach and have sought to design new light-emitting devices using charged metal complexes.

As such, a first aspect of the present invention provides a light emitting device comprising:

an anode;

a cathode;

a light emissive layer located between the anode and the cathode, said light emissive layer comprising a charged metal complex for emitting light and a counterion or counterions with sufficient charge to balance the charge on the charged metal complex; characterised in that the counterion or counterions are substantially immobile so that light output from the device is immediate, provided that the combined charged metal complex and counterion do not have General Formula I or II:

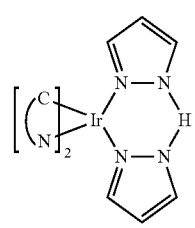

FIG. 1

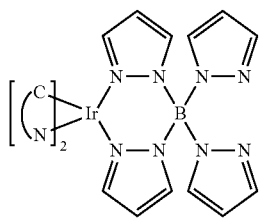

where C—N is a cyclometallated ligand.

The compounds having general formula I or II above are disclosed in WO 2004/017043 as general formulae N and V. WO 2004/017043 is concerned with blue shifting the emission of phosphorescent metal complexes by the introduction of a non-emissive anionic ligand. There is no requirement in WO 2004/017043 for the "emissive material" to be neutral and general formula II on page 20 of WO 2004/017043, for example, includes the emissive material being negatively charged.

A second aspect of the present invention provides a charged metal complex as defined in relation to the first aspect together with a counterion or counterions as defined in relation to the first aspect. The counterion or counterions are present in an amount sufficient to neutralise the charge on the charged metal complex so that the combined charged metal complex and counterion(s) is neutral.

A third aspect of the present invention provides a mixture containing the charge metal complex together with the counterion or counterions as defined in relation to the second aspect of the present invention.

A fourth aspect of the present invention provides the use of (i) a charged metal complex together with a counterion or counterions as defined in relation to the second aspect; or (ii) a mixture as defined in relation to the third aspect, for emitting light.

A fifth aspect of the present invention provides a method of making a device as defined in relation to the first aspect.

DETAILED DESCRIPTION

It will be, understood that in the device according to the first aspect of the present invention that there is little or no migration of the counterion(s) when the device is turned on. This means that, as compared with the prior art, there is no time delay with respect to emission, which occurs when counterions migrate through the device. This also means that the device provides a constant light output for a constant voltage. Moreover, the fact that a charged metal complex can be accommodated in the present device means that a wider variety of ligands can be used for a particular metal centre. This means that charged ligands can be used. This wider selection of available ligands in turn provides more possibilities for selecting emission colour and improving efficiency.

The charged metal complex may be fluorescent or phosphorescent. Preferably, the charged metal complex is phosphorescent. In this regard known charged metal complexes may be used in the present device.

The charged metal complex contains a metal M and coordinated ligands L. Suitable metals M include:

lanthanide metals such as cerium, samarium, europium, terbium, dysprosium, thallium, erbium and neodymium;

d-block metals, in particular those in rows 2 and 3 i.e. elements 39 to 48 and 72 to 80, in particular ruthenium, copper, chromium, molybdenum, rhodium, palladium, rhenium, osmium, iridium, platinum and gold; and metals forming fluorescent complexes such as aluminium, beryllium, zinc, mercury, cadmium and gallium.

The ligands (L) in the metal complex can be monodentate, bidentate or tridentate. For bidentate and tridentate ligands, the coordinating atoms may be linked so as to form an 7, 6, 5 or 4 membered ring when coordinated to M. A 6 membered ring is preferred and a 5 membered ring is most preferred. Suitable ligands will be known to those skilled in the art.

An example of a tridentate ligand is:

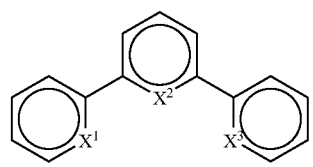

where X1, X2 and X3 independently are selected from N, C, O and S.

Preferably, X1=X2=X3=N.

A preferred group to be coordinated to M is a phenolic group:

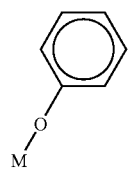

As such, a particularly preferred bidentate ligand is a quinolinate.

Suitable coordinating groups for the f-block metals include oxygen or nitrogen donor systems such as carboxylic acids, 1,3-diketonates, hydroxy carboxylic acids, Schiff bases including acyl phenols and iminoacyl groups. As is known, luminescent lanthanide metal complexes require sensitizing group(s) which have the triplet excited energy level higher than the first excited state of the metal ion. Emission is from an f-f transition of the metal and so the emission colour is determined by the choice of the metal. The sharp emission is generally narrow, resulting in a pure colour emission useful for display applications.

The d-block metals preferably form complexes with carbon or nitrogen donors such as porphyrin or bidentate ligands of formula III:

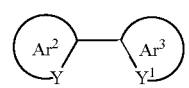

wherein Ar2 and Ar3 may be the same or different and are independently selected from optionally substituted aryl or heteroaryl; Y1 and Y may be the same or different and are independently selected from carbon or nitrogen; and Ar2 and Ar3 may be fused together. Ligands wherein Y is carbon and Y1 is nitrogen, or wherein Y and Y1 are both nitrogen are particularly preferred.

Examples of bidentate ligands are illustrated below:

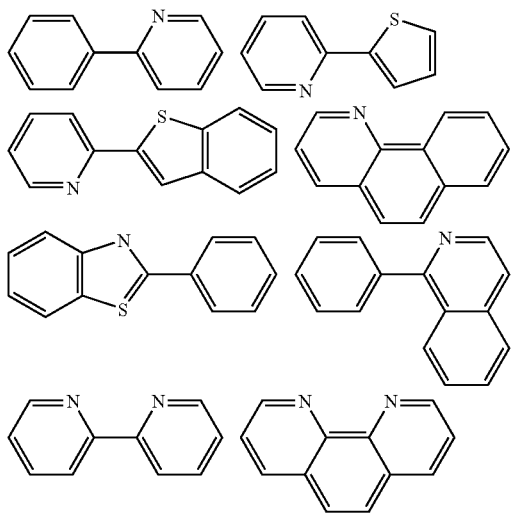

One or both of Ar2 and Ar3 may carry one or more substituents. Preferred substituents are as discussed above.

Other ligands suitable for use with d-block elements include diketonates, in particular acetylacetonate (acac); tri-arylphosphines and pyridine, each of which may be substituted.

As mentioned above, one of the advantages of the present invention is that a wider range of ligands may be used in the metal complex as compared with the prior art where, generally, the metal complex must be neutral. As such, charge ligands also may be used. Further, in a light emitting device according to the present invention, the metal complex is charged and counterions are present to balance this charge. Thus, there is no requirement to use a certain number of neutral ligands, which would otherwise be the case if a neutral metal complex with no counterions was desired. As a consequence, a higher than typical number of neutral ligands can be used.

It may be desirable for the charged metal complex and counterion(s) to be present with a host material in the light emissive layer.

The charged metal complex and counterion(s) may be mixed physically with the host material in the light emissive layer or may be covalently bound to the host material. In one preferred embodiment, the charged metal complex is blended with the host material in the light emissive layer. In another embodiment the charged metal complex is provided as a repeat unit, side chain substituent and/or end-group of a polymer. In another embodiment the metal complex is provided in a dendrimer. The core of the dendrimer will comprise the metal M.

The present invention therefore provides a blend comprising a charged metal complex and counterion(s) as defined above and a host material. The present invention further provides a polymer containing a charged metal complex as defined above as a repeat unit, side chain substituent and/or end group of the polymer. The present invention still further provides a dendrimer containing a charged metal complex as defined above.

The host material may also have charge transporting properties. Hole transporting host materials are particularly preferred such as the optionally substituted hole-transporting arylamine having the following formula:

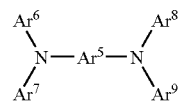

wherein Ar5 is an optionally substituted aromatic group, such as phenyl, or

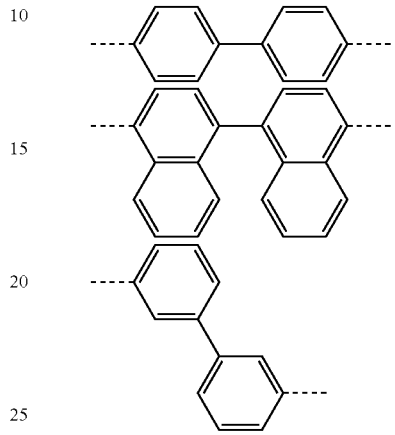

and Ar6, Ar7, Ar8 and Ar9 are optionally substituted aromatic or heteroaromatic groups (Shi et al (Kodak) U.S. Pat. No. 5,554,450. Van Slyke et al, U.S. Pat. No. 5,061,569. So et al (Motorola) U.S. Pat. No. 5,853,905 (1997)). Ar is preferably biphenyl. At least two of Ar6, Ar7, Ar8 and Ar9 may be bonded to either a thiol group, or a group containing a reactive unsaturated carbon-carbon bond. Ar6 and Ar7 and/or Ar8 and Ar9 are optionally linked to form a N containing ring, for example so that the N forms part of a carbazole unit e.g.

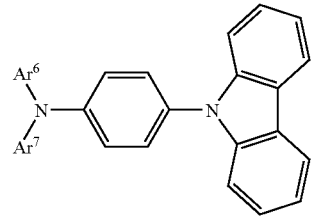

Host materials may alternatively possess electron transporting properties. Examples of electron transporting host materials are azoles, diazoles, triazoles, oxadiazoles, benzoxazoles, benzazoles and phenanthrolines, each of which may optionally be substituted. Particularly preferred substituents are aryl groups, in particular phenyl oxadiazoles, in particular aryl-substituted oxadiazoles. These host materials may exist in small molecule form or may be provided as repeat units of a polymer, in particular as repeat units located in the backbone of a polymer or as substituents pendant from a polymer backbone. Specific examples of electron transporting host materials include 3-phenyl-4-(1-naphthyl)-5-phenyl-1,2,4-triazole and 2,9-dimethyl-4,7-diphenyl-phenanthroline.

Host materials may be bipolar, i.e. capable of transporting holes and electrons: Suitable bipolar materials preferably contain at least two carbazole units (Shirota, J. Mater. Chem., 2000, 10, 1-25). In one preferred compound, both Ar6 and Ar7 and Ar8 and Ar9 as described above are linked to form carbazole rings and Ar5 is phenyl. Alternatively, a bipolar host material may be a material comprising a hole transporting segment and an electron transporting segment. An example of such a material is a polymer comprising a hole transporting segment and an electron transporting segment as disclosed in WO 00/55927 wherein hole transport is provided by a triarylamine repeat unit located within the polymer backbone and electron transport is provided by a conjugated polyfluorene chain within the polymer backbone. Alternatively, the properties of hole transport and electron transport may be provided by repeat units pendant from a conjugated or non-conjugated polymer backbone.

Specific examples of "small molecule" hosts include 4,4'-bis(carbazol-9-yl)biphenyl), known as CBP, and (4,4',4"-tris(carbazol-9-yl)triphenylamine), known as TCTA, disclosed in Ikai et al. (Appl. Phys. Lett., 79 no. 2, 2001, 156); and triarylamines such as tris-4-(N-3-methylphenyl-N-phenyl)phenylamine, known as MTDATA.

Homopolymers and copolymers may be used as hosts, including optionally substituted polyarylenes such as polyfluorenes, polyspirofluorenes, polyindenofluorenes or polyphenylenes as described above with respect to the hole transporting layer.

Specific examples of host polymers disclosed in the prior art include poly(vinyl carbazole) disclosed in, for example, Appl. Phys. Lett. 2000, 77(15), 2280; polyfluorenes in Synth. Met. 2001, 116, 379, Phys. Rev. B 2001, 63, 235206 and Appl. Phys. Lett. 2003, 82(7), 1006; poly[4-(N-4-vinylbenzyloxyethyl, N-methylamino)-N-(2,5-di-tert-butylphenyl-napthalimide] in Adv. Mater. 1999, 11(4), 285; poly(paraphenylenes) in J. Mater. Chem. 2003, 13, 50-55; poly[9,9'-di-n-hexyl-2,7-fluorene-alt-1,4-(2,5-di-n-hexyloxy)phenylene] as a host for both fac-tris(2-phenylpyridine)iridium(III) and 2,3,7,8,12,13,17,18-octaethyl-21H,23H-porphyrin platinum(II) in J. Chem. Phys. (2003), 118(6), 2853-2864; a random copolymer host of dioctylfluorene and dicyano-benzene in Mat. Res. Symp. Spring Meeting 2003 Book of Abstracts, Heeger, p. 214; and an AB copolymer of a fluorene repeat unit and phenylene repeat unit is disclosed in Mat. Res. Soc. Symp. Proc. 708, 2002, 131.

The concentration of the charged metal complex in the host material should be such that the film has a high electroluminescent efficiency. If the concentration of the emissive species is too high, quenching of luminescence can occur. A concentration in the range 0.01-49 wt %, more preferably 0.5-10 wt %, most preferably 1-3 wt % is generally appropriate.

Preferably, the counterion X comprises a substituted or unsubstituted aryl or heteroaryl group.

Optionally, the counterion X comprises a functional group such as a charge transport group, preferably a hole transport group.

Although the invention is not so limited, the counterion(s) may be functional in the present device. In this regard, the counterion can be a hole and/or electron transporting counterion. When the counterion is a hole and/or electron transporting counterion a host material may not be needed.

Typically, the charged metal complex will be positively charged. In this case a counter anion is used. In this case, preferably the metal complex has a charge in the range of +1 to +4.

In a first embodiment of the first aspect of the present invention, the counterion(s) is not bound to the charged metal complex. In this first embodiment the counterion(s) is rendered substantially immobile because of its size. The counterion is large or bulky and is not able to migrate through the light emissive layer when packed therein with the charged metal complex.

Preferred metals in the first embodiment are ruthenium, copper, chromium, molybdenum, rhodium, palladium, rhenium, osmium, iridium, platinum and gold.

In this first embodiment, preferred general formulae for the charge metal complex and counterion X are shown below in general formulae IV to XI. General formula V is particularly preferred.

Rhenium Complexes

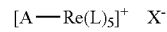

IV where A is a neutral, emissive ligand and each L independently is a neutral ligand. In the case of rhenium, L is preferably a strong field ligand, e.g. C=O or PR3 wherein each R independently represents an optionally substituted alkyl, aryl or heteroaryl group.

Two or more L groups may be linked, e.g. where L=trialkylphosphine then two such groups may form:

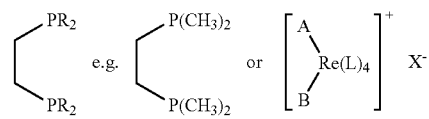

V where A and B represent neutral, emissive ligands which may optionally be linked, e.g. bipyridyl or phenanthroline and each L independently is a neutral ligand.

Iridium Complexes

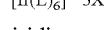

VI for iridium, suitable L groups include mono- bi- or tridentate ligands, e.g. bipyridyl, phenanthroline, triarylphosphine, terpyridine etc.

Again, preferably at least one L comprises a strong field ligand.

or

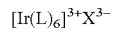

VII or

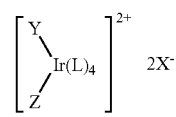

VIII wherein Y represents a charged ligand (e.g. chloride) and Z represents a neutral ligand, (e.g. triarylphosphine). In a preferred embodiment, X and Y are linked—e.g. X—Y=phenylpyridine.

If Y or Z is a strong field ligand then L may or may not be a strong field ligand.

or

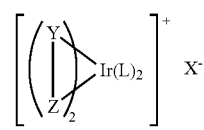

IX

Osmium Complexes

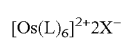

X and further compounds analogous to iridium complexes shown above.

Fluorescent Complexes

Al analogues of the aforementioned Ir and Os complexes, in particular:

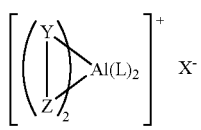

XI

Beryllium, gallium and zinc are other fluorescent metals
Preferably for Al, Y—Z is quinolinate, in particular 8-quinolinate i.e.

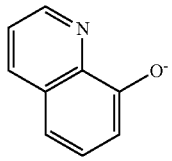

As mentioned above, the charged metal complex may be incorporated into a polymer or dendrimer. As such, a preferred light emissive layer according to the first embodiment of the first aspect of the present invention comprises a cationic metal complex incorporated into polymer with associated non-coordinating anions.

Turning to the counterion in the first embodiment, one class of bulky/large counterions is those where the counterion X preferably comprises a substituted or unsubstituted aryl or heteroaryl group, in particular phenyl (for example, tetraphenylborate). The aryl or heteroaryl group may form part of a larger charge transporting group (such as the triarylamine substituted units shown below) or may be substituted with a charge transporting group (such as tetraphenylborate substituted with carbazole as shown below). Carbazole and triarylamine are preferred charge transport groups. Advantageously, carbazole and triarylamine are hole transport groups. As such, carbazole and triarylamine are particularly preferred for high triplet energy metal complexes.

A class of bulky/large anions that is particularly useful in the first embodiment is based on a tetraphenylborate core with the general formula BAr(4-x)Ax, where Ar is an aryl or heteroaryl group (preferably phenyl); x is in the range of from 1 to 4; and A is a functional moiety.

Useful bulky/large anions for the case where x=1 are shown below:

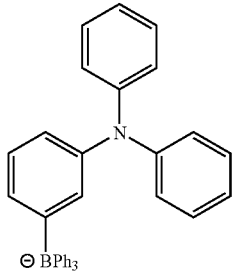

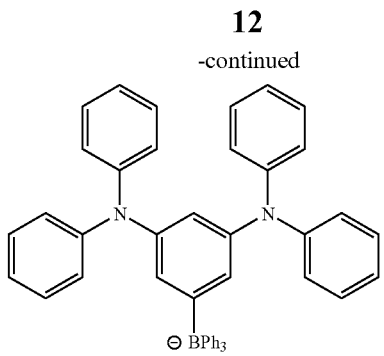

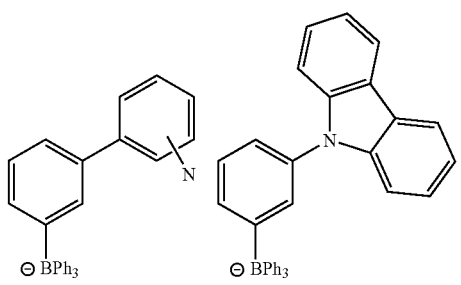

o-, m- or p-

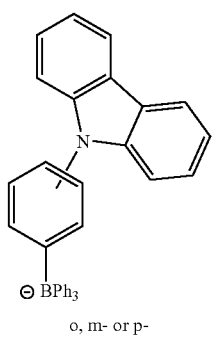

o, m- or p-

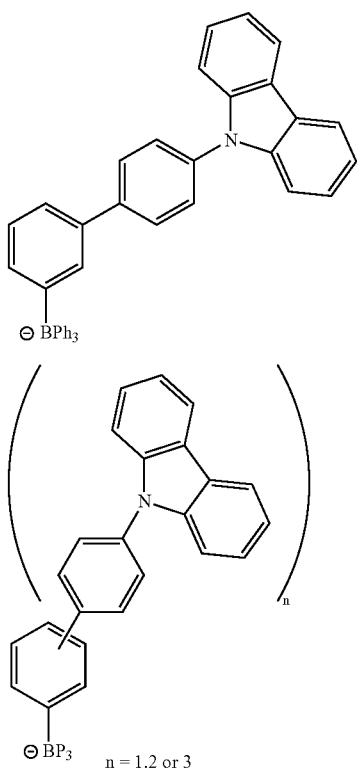

n = 1.2 or 3

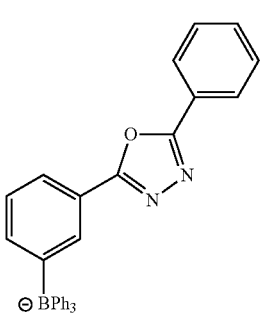

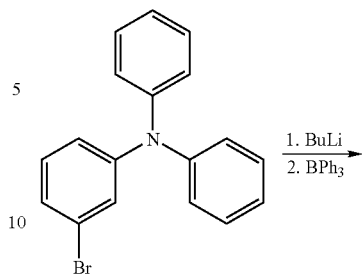

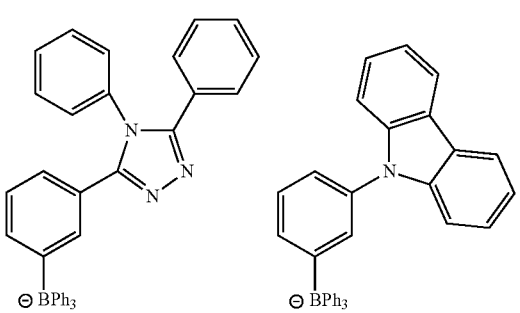

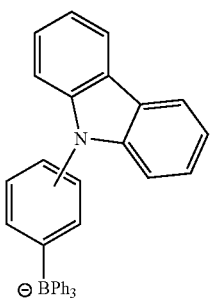

o, m- or p-

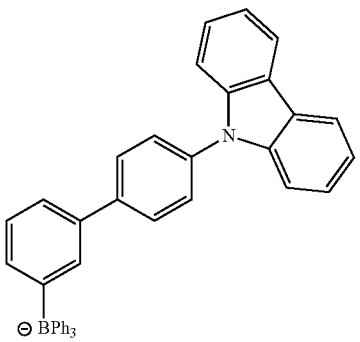

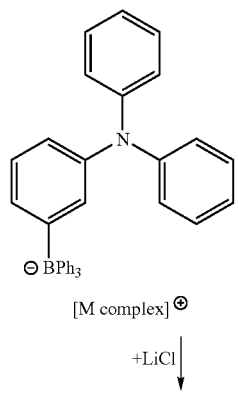

Where a carbazole unit is present, it may also be bound to the tetraarylborate group through an aromatic carbon, in which case the nitrogen atom may be unsubstituted or (more preferably) substituted, in particular with an alkyl group that may serve to increase solubility. J Am Chem Soc 126, 19, 2004, p. 6035 describes the effect of the substitution position of carbazoles on triplet and singlet energy levels.

By way of example, a general synthetic strategy for preparing these types of anion is:

Another class of bulky/large counterions consists of counterions containing a metal. In this case, the charged metal complex and counterion both independently contain a metal. There are a large number of known complex counterions, particularly anions that contain a metal and the skilled person will be able to select suitable candidates. A simple example is $[Fe(CN)6]^-$.

The synthesis of complexes with counterions where the counterion is not bound to the complex can be achieved by a variety of means well known to those skilled in the art. Examples include:

1) Replacement of a Small Ion with a Large Ion.

An example of this type of displacement is shown below. Typically the complex is treated with a large excess of a salt of the new ion. Reaction conditions can be adjusted so that the simple salt which is also produced, in this example NaCl, is insoluble in the reaction solvent so as to drive the equilibrium towards the complex salt with the large counter ion.

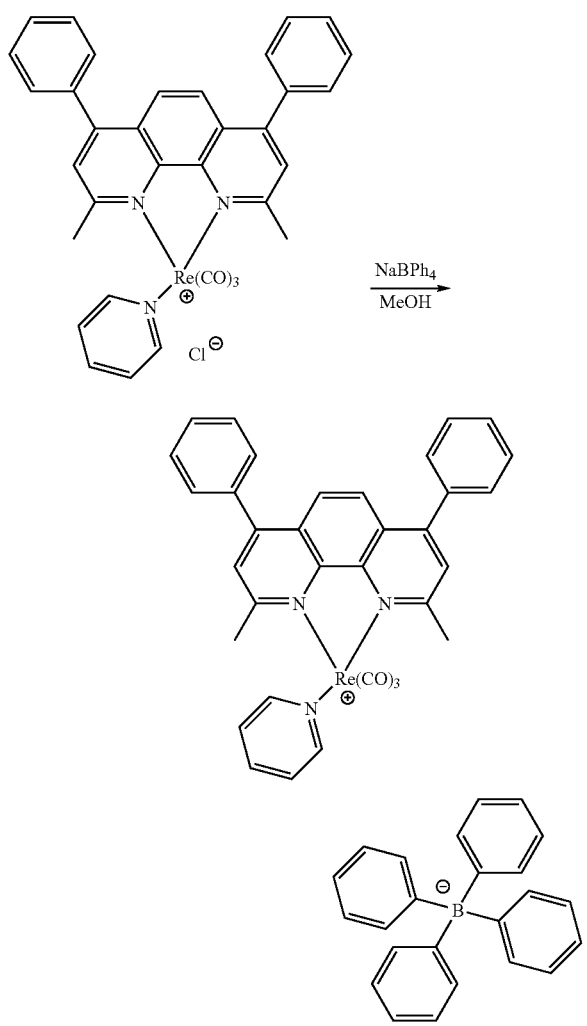

2) Redox Synthesis

A target complex can be synthesised by the chemical or electrochemical oxidation or reduction of a precursor complex in the presence of bulky ions. An example of an oxidation is:

[M(II)(L-L)2L'2]+A+[X]→[M(III)(L-L)2L'2]+[X]—+A++e− where M is a metal ion with the oxidation state indicated in brackets; L-L is a bidentate, mono-anionic ligand; L' is a unidentate neutral ligand; A is a cation; X is a bulky anion; e− is an electron removed either chemically or electrochemically This reaction would typically be carried out in an inert solvent such as acetonitrile, dichloromethane or dimethylformamide.

In a second embodiment of the first aspect of the present invention, the counterion(s) is bound to a ligand in the metal complex. Thus, the counterion(s) is substantially immobile because it effectively is tethered to the charged metal complex.

It will be understood that, in the second embodiment, the charged centre of the counterion is not directly bound to the metal M in the metal complex.

In the second embodiment, preferred metals include ruthenium, copper, chromium, molybdenum, rhodium, palladium, rhenium, osmium, iridium, platinum, gold, aluminium, beryllium, zinc, mercury, cadmium and gallium.

Further, in the second embodiment, counterion X preferably represents an ammonium group or a borate. For example, X preferably has general formula R3N+- or R3B-- if X is bound to the metal complex in one place; or —(R)2N+- or —(R)2B-- if X is bound to the metal complex in two places. Each R independently is aryl, heteroaryl, alkyl, halide or hydrogen.

Preferably, the ligand or ligands to which the counterion X is bound are chelating, bi- or tridentate ligands. This gives stability to the complex. Some examples are shown in general formulae below XII to XV:

$$M\begin{matrix}L\\L'\end{matrix}X^-  \qquad \text{XII}$$

$$M\begin{matrix}L\\L'\end{matrix}X^+ \qquad \text{XIII}$$

$$M\begin{matrix}L-X^-\\L'\end{matrix} \qquad \text{XIV}$$

$$M\begin{matrix}L-X^+\\L'\end{matrix} \qquad \text{XV}$$

Preferred L and L' comprise an aryl or heteroaryl group, such as phenylene, pyridyl and phenolate. Preferred heteroaryl groups include N-donor heteroaryl groups. Optionally, the heteroaryl group may contain more than one heteroatom in a single ring.

Examples of counterions bound to ligands are:

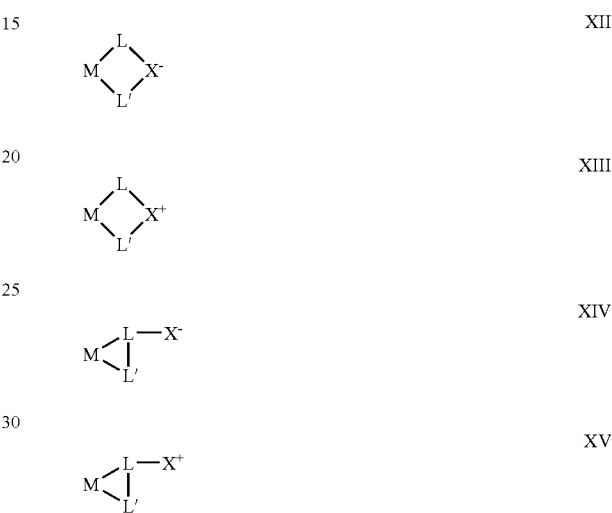

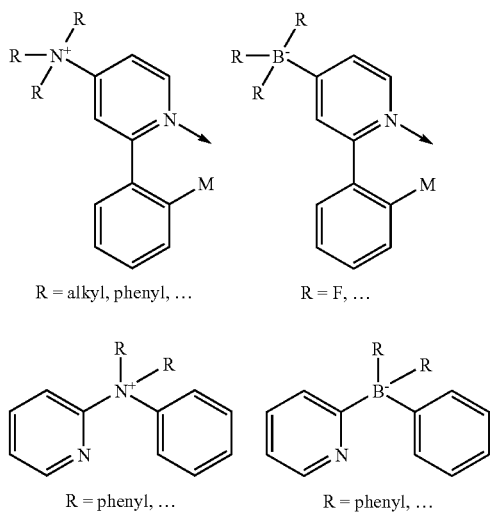

This allows the formation of complexes such as:

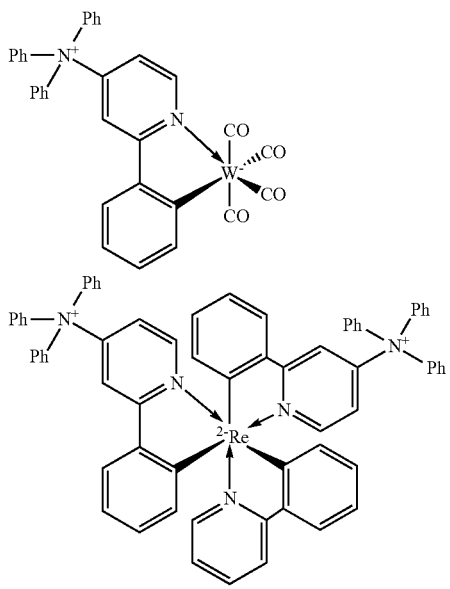

Referring to the device structure in general for the first and second embodiment and to FIG. 1, a light emitting device according to the invention may comprise a substrate 1, an anode 2 (preferably of indium tin oxide), a layer 3 of organic hole injection material, an electroluminescent layer 4 and a cathode 5.

As shown in FIG. 1, usually, the anode is provided on a substrate in the LED according to the present invention. Optical devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

Although not essential, the presence of a hole injection layer between the anode and the light emissive layer is desirable as it assists hole injection from the anode into the emissive layer. Examples of organic hole injection materials include polyethylenedioxythiophene (PEDT) with a suitable counterion such as poly(styrene sulfonate) as disclosed in EP 0901176 and EP 0947123, or polyaniline as disclosed in U.S. Pat. No. 5,723,873 and U.S. Pat. No. 5,798,170.

Charge transporting layers (not shown) comprising semiconducting materials may also be provided. A hole transporting layer may be provided between the anode and the emissive layer and an electron transporting layer may be provided between the cathode and the emissive layer.

The cathode is selected so that electrons are efficiently injected into the device and as such may comprise a single conductive material such as a layer of aluminium. Alternatively, it may comprise a plurality of metals, for example a bilayer of calcium and aluminium as disclosed in WO 98/10621. A thin layer of dielectric material such as lithium fluoride optionally may be provided between the light emissive layer and the cathode to assist electron injection as disclosed in, for example, WO 00/48258.

The device is preferably encapsulated with an encapsulant to prevent ingress of moisture and oxygen. Suitable encapsulants include a sheet of glass, films having suitable barrier properties such as alternating stacks of polymer and dielectric as disclosed in, for example, WO 01/81649 or an airtight container, optionally with a desiccant, as disclosed in, for example, WO 01/19142.

In a practical device, at least one of the electrodes is semi-transparent in order that light may be emitted. Where the anode is transparent, it typically comprises indium tin oxide. Examples of transparent cathodes are disclosed in, for example, GB 2348316.

The invention claimed is:

1. A light emitting device comprising:
   an anode;
   a cathode;
   a light emissive layer located between the anode and the cathode, said light emissive layer comprising a charged metal complex for emitting light and a counterion or counterions with sufficient charge to balance the charge on the charged metal complex; wherein the counterion or counterions are substantially immobile so that light output from the device is immediate, provided that the combined charged metal complex and counterion do not have General Formula I or II:

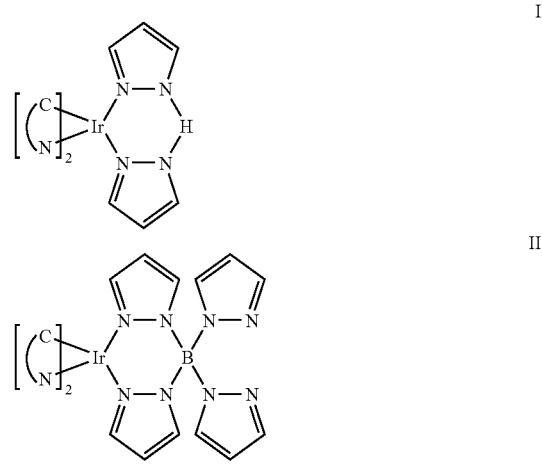

where C—N is a cyclometallated ligand,
the charged metal complex containing a metal M and coordinated ligands L,
the metal M is selected from the group consisting of ruthenium, copper, chromium, molybdenum, rhodium, palladium, rhenium, osmium, iridium, platinum, gold, aluminum, beryllium, zinc, mercury, cadmium, and gallium, and
the counterion is bound to a monodentate, bidentate, or tridentate ligand in the metal complex, wherein the bidentate ligand has one of the following formulae:

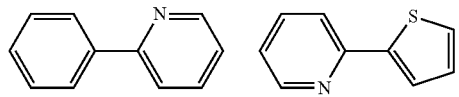

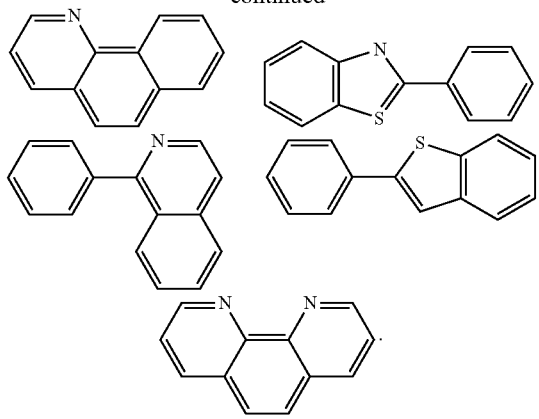

2. A light emitting device according to claim 1 wherein the charged metal complex is phosphorescent.

3. A light emitting device according to claim 1, wherein the charged metal complex and counterion(s) are blended with a host material in the light emissive layer.

4. A light emitting device according to claim 1, wherein a polymer or dendrimer contains the metal complex.

5. A light emitting device according to claim 1, wherein the counterion is a hole and/or electron transporting counterion.

6. A light emitting device according to claim 1, wherein the charged metal complex has a charge in the range of +1 to +4.

7. A light emitting device according to claim 1, wherein the counterion comprises an aryl or heteroaryl group.

8. A light emitting device according to claim 1, wherein the counterion comprises an ammonium group or a borate.

9. A charged metal complex as defined in claim 1 together with sufficient counterions as defined in claim 1 to neutralize the charged metal complex.

10. A mixture containing the charged metal complex and counterion or counterions as defined in claim 9.

11. A method of making a light emitting device as defined in claim 1 comprising the steps of forming the anode, the cathode, and the light emissive layer so that the light emissive layer is located between the anode and the cathode.

12. A light emitting device according to claim 1 wherein the counterion comprises $R_3B^-$— or $R_3N^+$—, where each R is independently selected from the group consisting of aryls, heteroaryls, alkyls, halides, and halogens.

13. A light emitting device according to claim 3 wherein the host material has charge transporting properties.

14. A light emitting device according to claim 3 wherein a concentration the charged metal complex in the host material is in the range of 0.5 to 10 weight percent.

* * * * *